United States Patent
Cho

(10) Patent No.: US 10,573,631 B2
(45) Date of Patent: Feb. 25, 2020

(54) MULTI-PHASE POWER CONVERTER WITH COMMON CONNECTIONS

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 16/100,005

(22) Filed: Aug. 9, 2018

(65) Prior Publication Data
US 2018/0350789 A1  Dec. 6, 2018

Related U.S. Application Data

(63) Continuation of application No. 15/287,280, filed on Oct. 6, 2016, now Pat. No. 10,056,362.

(51) Int. Cl.
*H01L 25/18* (2006.01)
*H01L 23/495* (2006.01)
(Continued)

(52) U.S. Cl.
CPC .......... *H01L 25/18* (2013.01); *H01L 23/3114* (2013.01); *H01L 23/49503* (2013.01); *H01L 23/49524* (2013.01); *H01L 23/49541* (2013.01); *H01L 23/49562* (2013.01); *H01L 23/49575* (2013.01); *H01L 24/32* (2013.01); *H01L 24/40* (2013.01); *H01L 24/48* (2013.01); *H01L 24/83* (2013.01); *H01L 24/84* (2013.01);
(Continued)

(58) Field of Classification Search
CPC ........... H01L 23/3114; H01L 23/49575; H01L 23/49503
See application file for complete search history.

(56) References Cited

U.S. PATENT DOCUMENTS 7,173,333 B2  2/2007  Hata et al.
7,449,778 B2  11/2008  Sander
(Continued)

FOREIGN PATENT DOCUMENTS

CN   102569361 A   7/2012
CN   102598492 A   7/2012
(Continued)

OTHER PUBLICATIONS

International Rectifier, "IRDM982 Series—IRDM982-025MB, IRDM982-035MB Complete Motion Controller Module for PM AC fan", Apr. 8, 2015, 27 pp.
(Continued)

*Primary Examiner* — Amar Movva
(74) *Attorney, Agent, or Firm* — Shumaker & Sieffert, P.A.

(57) ABSTRACT

In some examples, a device comprises at least two semiconductor die, wherein each respective semiconductor die of the at least two semiconductor die comprises at least two power transistors, an input node on a first side of the respective semiconductor die, a reference node on the first side of the respective semiconductor die, and a switch node on a second side of the respective semiconductor die. The device further comprises a first conductive element electrically connected to the respective input nodes of the at least two semiconductor die. The device further comprises a second conductive element electrically connected to the respective reference nodes of the at least two semiconductor die.

20 Claims, 8 Drawing Sheets

(51) Int. Cl.
*H01L 23/31* (2006.01)
*H01L 23/00* (2006.01)
*H01L 25/065* (2006.01)
*H01L 25/00* (2006.01)
*H02M 7/00* (2006.01)

(52) U.S. Cl.
CPC .......... *H01L 24/85* (2013.01); *H01L 25/0655* (2013.01); *H01L 25/50* (2013.01); *H02M 7/003* (2013.01); H01L 2224/29147 (2013.01); H01L 2224/32245 (2013.01); H01L 2224/37147 (2013.01); H01L 2224/40245 (2013.01); H01L 2224/45124 (2013.01); H01L 2224/48245 (2013.01); H01L 2924/1033 (2013.01); H01L 2924/10253 (2013.01); H01L 2924/10272 (2013.01); H01L 2924/1203 (2013.01); H01L 2924/1305 (2013.01); H01L 2924/1306 (2013.01); H01L 2924/13055 (2013.01); H01L 2924/13064 (2013.01); H01L 2924/13067 (2013.01); H01L 2924/13091 (2013.01); H01L 2924/1425 (2013.01); H01L 2924/1426 (2013.01)

(56) References Cited

U.S. PATENT DOCUMENTS

| | | | |
|---|---|---|---|
| 7,880,280 B2 | 2/2011 | Otremba | |
| 7,943,955 B2 | 5/2011 | Haeberlen et al. | |
| 8,138,585 B2 | 3/2012 | Liu et al. | |
| 8,378,655 B2 | 2/2013 | Larson | |
| 8,488,316 B2 | 7/2013 | Zeng et al. | |
| 8,704,269 B2 | 4/2014 | Macheiner et al. | |
| 9,087,829 B2 | 7/2015 | Macheiner et al. | |
| 9,324,851 B2 | 4/2016 | Nega et al. | |
| 2005/0127755 A1 | 6/2005 | Aichriedler et al. | |
| 2006/0071860 A1 | 4/2006 | Hozoji et al. | |
| 2007/0081280 A1 | 4/2007 | Strzalkowski et al. | |
| 2007/0252265 A1 | 11/2007 | Sander | |
| 2012/0014059 A1 | 1/2012 | Zeng et al. | |
| 2012/0161128 A1 | 6/2012 | Macheiner et al. | |
| 2013/0032855 A1 | 2/2013 | Macheiner et al. | |
| 2013/0049137 A1 | 2/2013 | Uno et al. | |
| 2015/0145112 A1 | 5/2015 | Otremba | |
| 2015/0380353 A1 | 12/2015 | Bauer et al. | |
| 2016/0172280 A1 | 6/2016 | Ranmuthu | |
| 2017/0230017 A1 | 8/2017 | Hori | |
| 2018/0102349 A1 | 4/2018 | Cho | |

FOREIGN PATENT DOCUMENTS

| | | |
|---|---|---|
| CN | 102915987 A | 2/2013 |
| CN | 104681553 A | 6/2015 |
| DE | 102006020243 B3 | 1/2008 |
| DE | 102008006835 A1 | 9/2008 |
| DE | 102012213208 A1 | 2/2013 |
| DE | 102014117019 A1 | 5/2015 |
| DE | 102014203899 A1 | 9/2015 |
| WO | 2009154969 A2 | 12/2009 |

OTHER PUBLICATIONS

Prosecution History from U.S. Appl. No. 15/287,280, dated from Dec. 22, 2017 through Apr. 23, 2018, 34 pp.

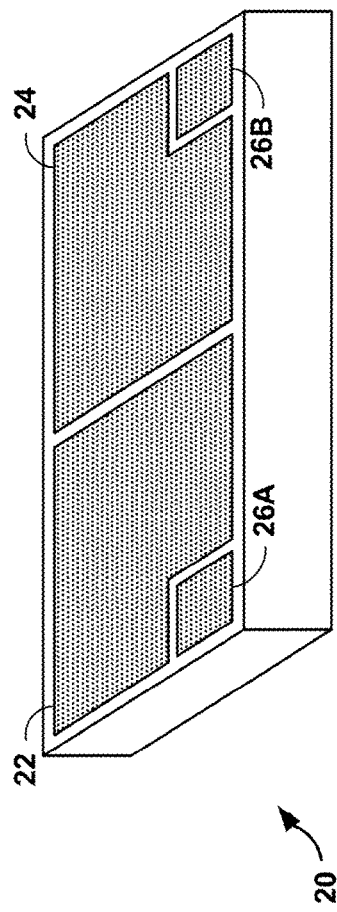
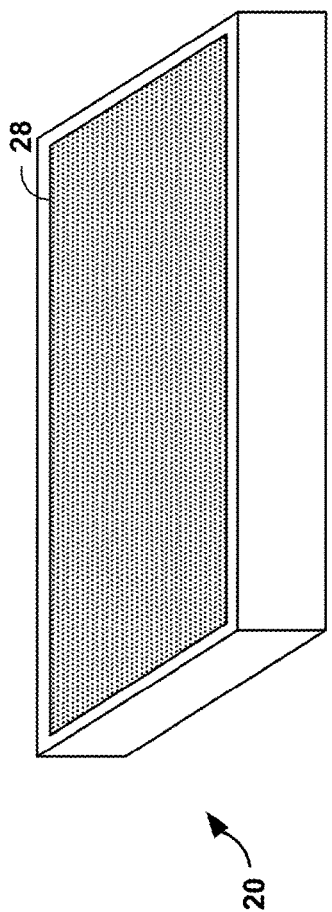
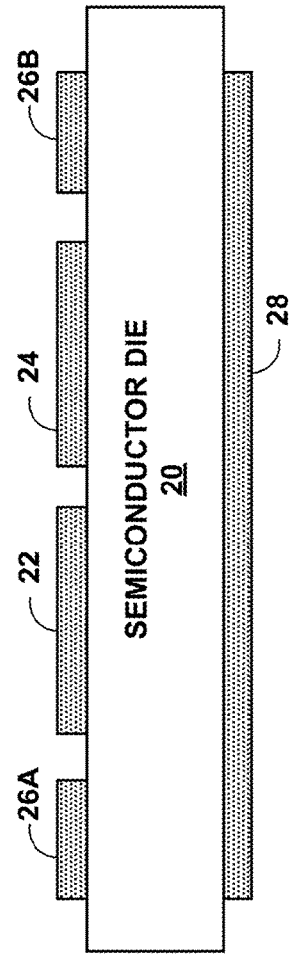
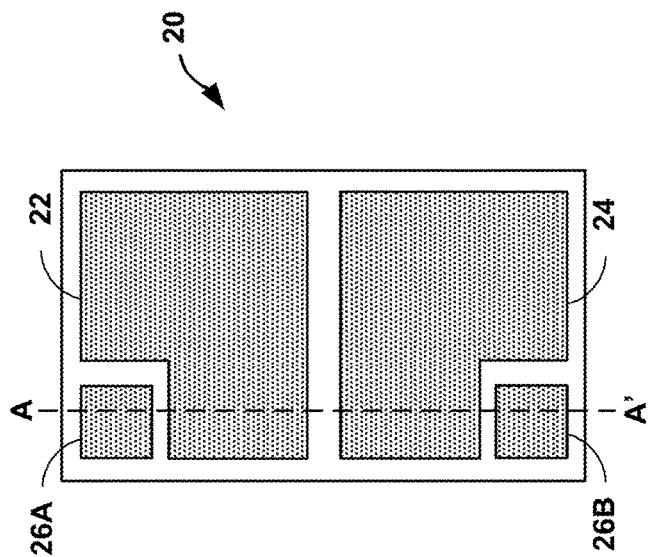

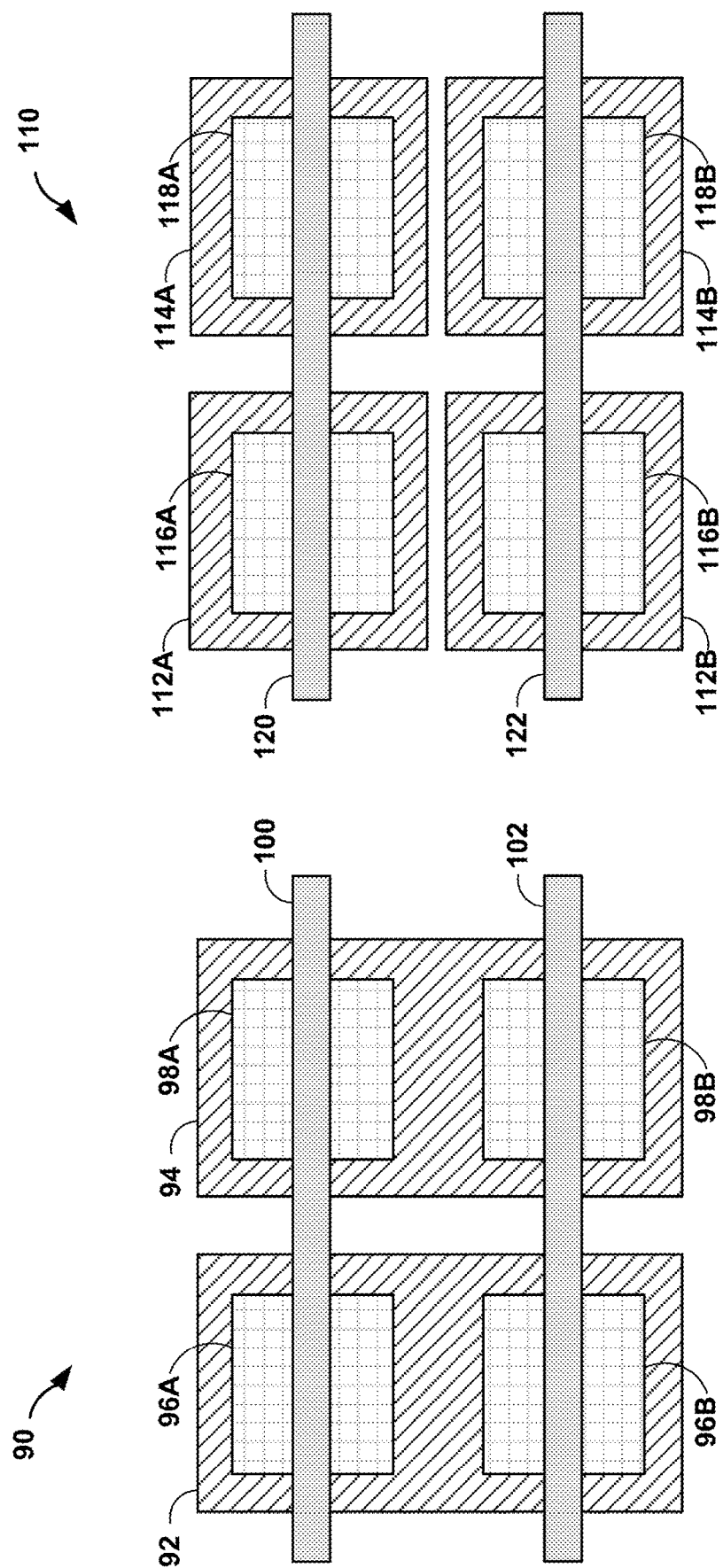

US 10,573,631 B2

MULTI-PHASE POWER CONVERTER WITH COMMON CONNECTIONS

The present application is a continuation of U.S. application Ser. No. 15/287,280, filed Oct, 6, 2016, which will issue as U.S. Pat. No. 10,056,362 on Aug. 21, 2018, the entirety of which is hereby incorporated by reference.

TECHNICAL FIELD

This disclosure relates to semiconductor packaging.

BACKGROUND

A half-bridge circuit may include two analog devices or switches. Half-bridge circuits may be used in power supplies for motors, in rectifiers, and for power conversion. Each half-bridge package has several contacts and may include several conductive paths to connect the contacts to each other and to external components.

SUMMARY

This disclosure describes techniques for a device comprising at least two semiconductor die, wherein each respective semiconductor die of the at least two semiconductor die comprises at least two power transistors, an input node on a first side of the respective semiconductor die, a reference node on the first side of the respective semiconductor die, and a switch node on a second side of the respective semiconductor die. The device further comprises a first conductive element electrically connected to the respective input nodes of the at least two semiconductor die. The device further comprises a second conductive element electrically connected to the respective reference nodes of the at least two semiconductor die.

In some examples, a method comprises electrically connecting a first conductive element to at least two input nodes on respective first sides of at least two semiconductor die and electrically connecting a second conductive element to at least two reference nodes on respective first sides of the at least two semiconductor die. Each semiconductor die of the at least two semiconductor die comprises at least two power transistors, an input node on a first side of the respective semiconductor die, a reference node on the first side of the respective semiconductor die, and a switch node on a second side of the respective semiconductor die.

In some examples, a power converter comprises at least two semiconductor die, wherein each semiconductor die of the at least two semiconductor die comprises a power transistor, an input node or a reference node on a first side of the respective semiconductor die, a control node on a first side of the respective semiconductor die, and a switch node on a second side of the respective semiconductor die. The power converter further comprises a first conductive element electrically connected to the respective input nodes of the at least two semiconductor die. The power converter further comprises a second conductive element electrically connected to the respective reference nodes of the at least two semiconductor die. The power converter further comprises at least two die paddles, wherein each switch node of each respective semiconductor die of the at least two semiconductor die is electrically connected to a respective die paddle of the at least two die paddles, and each die paddle of the at least two die paddles is electrically isolated from other die paddles of the at least two die paddles.

The details of one or more examples are set forth in the accompanying drawings and the description below. Other features, objects, and advantages will be apparent from the description and drawings, and from the claims.

BRIEF DESCRIPTION OF DRAWINGS

FIG. 2 is a top-view diagram of a semiconductor die comprising two power transistors, in accordance with some examples of this disclosure.

FIG. 3 is a perspective-view diagram of a first side of a semiconductor die comprising two power transistors, in accordance with some examples of this disclosure.

FIG. 4 is a perspective-view diagram of a second side of a semiconductor die comprising two power transistors, in accordance with some examples of this disclosure.

FIG. 5 is a side-view diagram of a semiconductor die comprising two power transistors, in accordance with some examples of this disclosure.

FIG. 10 is a top-view diagram of a device comprising continuous die paddles, in accordance with some examples of this disclosure.

FIG. 11 is a top-view diagram of a device comprising divided die paddles, in accordance with some examples of this disclosure.

DETAILED DESCRIPTION

Figure 1:
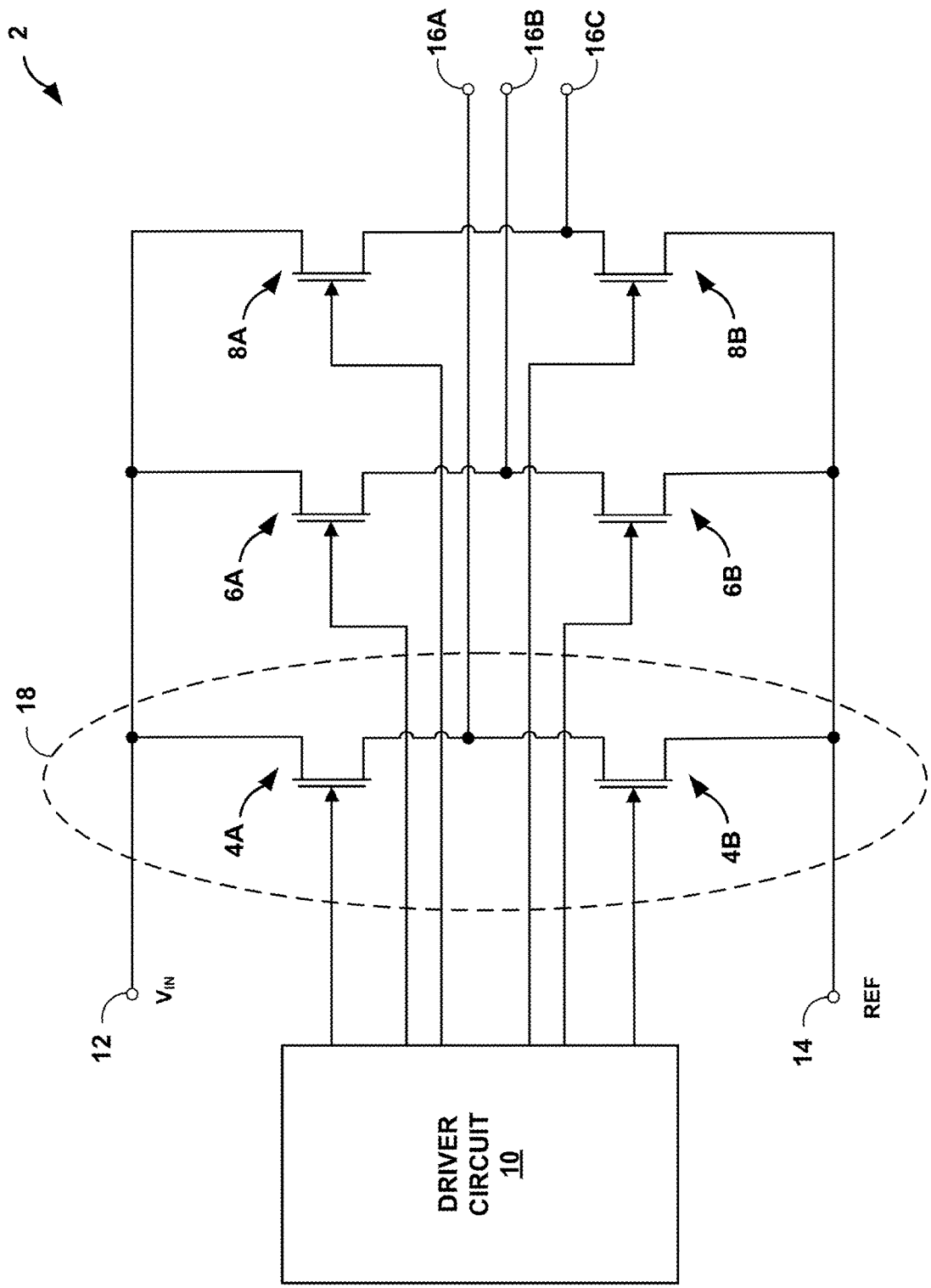
FIG. 1 is a circuit diagram of a multi-phase power converter, in accordance with some examples of this disclosure.

FIG. 1 is a circuit diagram of a multi-phase power converter, in accordance with some examples of this disclosure. In some examples, device 2 may comprise a multi-phase power converter such as a half-bridge direct-current-to-direct-current (DC/DC) buck converter for converting an input DC signal to an output DC signal with a lower voltage.

For each phase, a multi-phase power converter may comprise a half-bridge circuit. As a DC-to-DC buck converter, device 2 may operate as a voltage regulator in a variety of applications. In some examples, device 2 may be designed for high-power applications large amounts of current and high voltages. However, the techniques of this disclosure may apply to other circuits and configurations, such as other power converters, including multi-phase power converters and alternating-current-to-DC (AC/DC) power converters.

Device 2 may include transistors 4A, 4B, 6A, 6B, 8A, 8B and driver circuit 10. In some examples, device 2 may contain more or fewer components than depicted in FIG. 1. Device 2 may include input node 12, reference node 14, and output nodes 16A-16C, as well as other nodes not shown in FIG. 1. Nodes 12, 14, and 16A-16C may be configured to connect to external components. For example, input node 12 may connect to an input voltage such as a power supply, reference node 14 may connect to a reference voltage, such as reference ground, and output nodes 16A-16C may connect to a load such as an electronic device. Each output nodes 16A-16C may supply one phase of an output voltage to another device or circuit. In some examples, driver circuit 10 may connect to an external circuit through a node (not shown in FIG. 1).

Transistors 4A, 4B, 6A, 6B, 8A, 8B may comprise metal-oxide semiconductor (MOS) field-effect transistors (FETs), bipolar junction transistors (BJTs), and/or insulated-gate bipolar transistors (IGBTs). Transistors 4A, 4B, 6A, 6B, 8A, 8B may comprise n-type transistors or p-type transistors. In some examples, transistors 4A, 4B, 6A, 6B, 8A, 8B may comprise other analog devices such as diodes. Transistors 4A, 4B, 6A, 6B, 8A, 8B may also include freewheeling diodes connected in parallel with transistors to prevent reverse breakdown of transistors 4A, 4B, 6A, 6B, 8A, 8B. In some examples, transistors 4A, 4B, 6A, 6B, 8A, 8B may operate as switches, as analog devices, and/or power transistors.

Although, transistors 4A, 4B, 6A, 6B, 8A, 8B are shown in FIG. 1 as MOSFET symbols, it is contemplated that any electrical device that is controlled by a voltage may be used in place of the MOSFETs as shown. For example, transistors 4A, 4B, 6A, 6B, 8A, 8B may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Transistors 4A, 4B, 6A, 6B, 8A, 8B may comprise various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

Driver circuit 10 may deliver signals and/or voltages to the control terminals of transistors 4A, 4B, 6A, 6B, 8A, 8B. Driver circuit 10 may perform other functions. Together, transistors 4A, 4B, 6A, 6B, 8A, 8B and driver circuit 10 may comprise one or more semiconductor package such as a semiconductor die, chip-embedded substrate, an integrated circuit (IC), or any other suitable package. In some examples, driver circuit 10 may be integrated into the package with one or more of transistors 4A, 4B, 6A, 6B, 8A, 8B, or driver circuit 10 may be a separate IC.

Half-bridge circuit 18 may comprise transistors 4A, 4B. Transistors 4A, 4B may be coupled to each other and to output node 16A. Half-bridge circuit 18 may produce one phase of an output voltage for device 2. Transistors 6A, 6B and transistor 8A, 8B may each produce other phases of the output voltage for device 2.

FIG. 2 is a top-view diagram of a semiconductor die 20 comprising two power transistors, in accordance with some examples of this disclosure. The high-side transistor may comprise a drain terminal electrically connected to input node 22, control terminal 26A, and a source terminal (not shown in FIG. 2). The low-side transistor may comprise a source terminal electrically connected to reference node 24, control terminal 26B, and a drain terminal (not shown in FIG. 2).

The high-side transistor may comprise a finFET, and the low-side transistor may comprise a smart FET (SFET). In some examples where the transistors are BJTs or IGBTs, the drain terminals of the transistors may comprise collector terminals, the source terminals may comprise emitter terminals, and the gate terminals (or control terminals) may comprise base terminals.

FIG. 3 is a perspective-view diagram of a first side of a semiconductor die 20 comprising two power transistors, in accordance with some examples of this disclosure. The high-side transistor and the low-side transistor in semiconductor die 20 may comprise the same or similar terminals and nodes as described with respect to FIG. 2.

FIG. 4 is a perspective-view diagram of a second side of a semiconductor die 20 comprising two power transistors, in accordance with some examples of this disclosure. Switch node 28 may be electrically connected to a source terminal of the high-side transistor and a drain terminal of the low-side transistor. Switch node 28 may comprise an output node, such as output node 16A in FIG. 1.

FIG. 5 is a side-view diagram of a semiconductor die 20 comprising two power transistors, in accordance with some examples of this disclosure. The high-side transistor and the low-side transistor in semiconductor die 20 may comprise the same or similar terminals and nodes as described with respect to FIGS. 2-4. FIG. 5 may correspond to the dashed line A-A' in FIG. 2.

Figure 6:
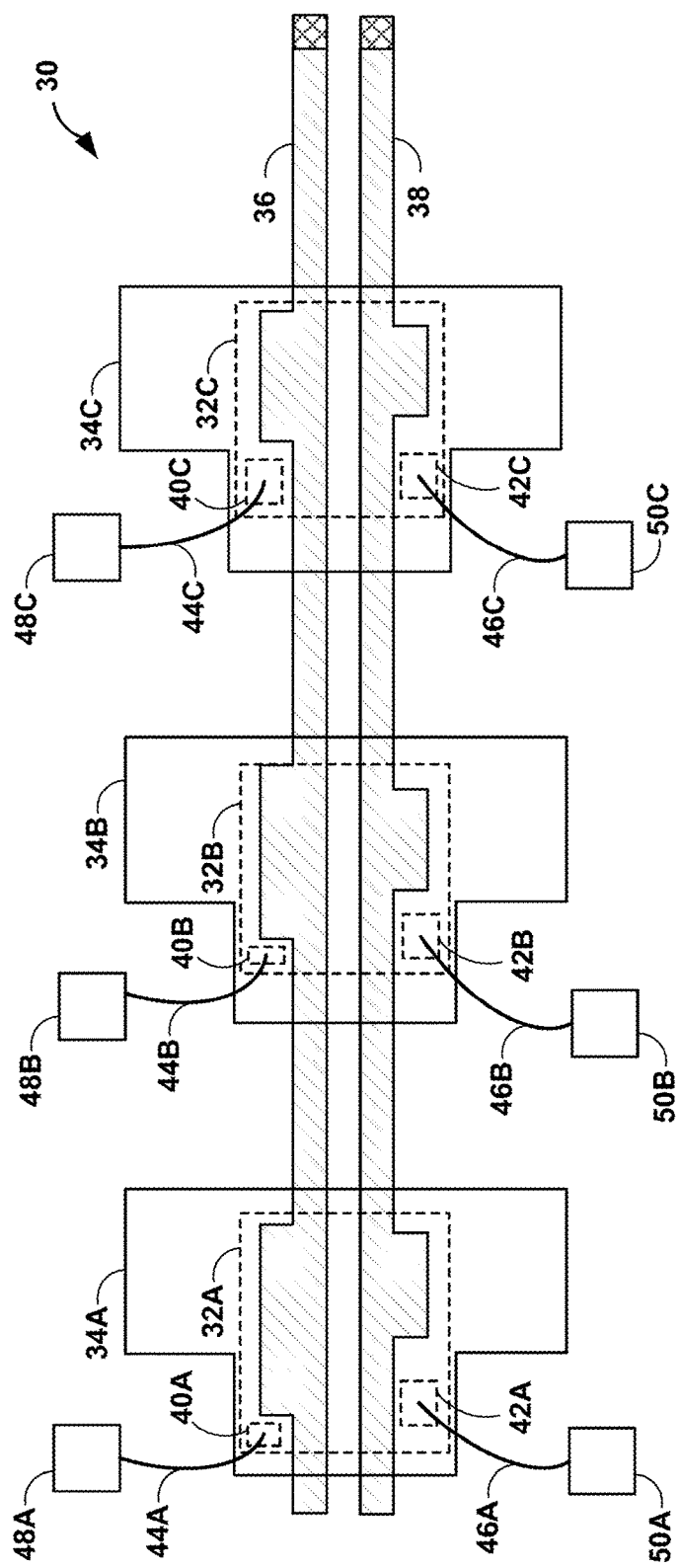
FIG. 6 is a top-view diagram of a multi-phase power converter comprising three semiconductor die, in accordance with some examples of this disclosure.

FIG. 6 is a top-view diagram of a multi-phase power converter 30 comprising three semiconductor die 32A-32C, in accordance with some examples of this disclosure. A respective switch node of each of semiconductor die 32A-32C may be electrically connected to a respective die paddle of die paddles 34A-34C. Each of die paddles 34A-34C may be electrically isolated from the other die paddles of die paddles 34A-34C. Moreover, each of die paddles 34A-34C may comprise an output node of device 30. Each of die paddles 34A-34C is depicted as having a larger footprint than each of semiconductor die 32A-32C, but semiconductor die 32A-32C and die paddles 34A-34C may be any suitable size and shape.

Semiconductor die 32A-32C may comprise control terminals 40A-40C and 42A-42C for each transistor in semiconductor die 32A-32C. Each of control terminals 40A-40C and 42A-42C may be electrically connected by wire bonds 44A-44C and 46A-46C to one or more driver circuits 48A-48C and 50A-50C. Multi-phase power converter 30 may be partially or fully encapsulated to electrically isolate wire bonds 44A-44C and 46A-46C from external components. In some examples, such as the device depicted in FIGS. 8-15, control terminals 40A-40C and 42A-42C may be electrically connected by leadframes and/or metal layers to driver circuits 48A-48C and 50A-50C.

In according with the techniques of this disclosure, first conductive element 36 may be electrically connected to each respective input node of semiconductor die 32A-32C. Second conductive element 38 may be electrically connected to each respective reference node of semiconductor die 32A-32C. Using a single conductive element for the input nodes and the reference nodes of semiconductor die 32A-32C may provide significant benefits including reduced parasitic capacitances in multi-phase power converter 30. A single conductive element may reduce the number of components in multi-phase power converter 30, thereby simplifying the design/fabrication process and reducing cost. A single conductive element may also shorten the conductive path between semiconductor die 32A-32C.

Figure 7:
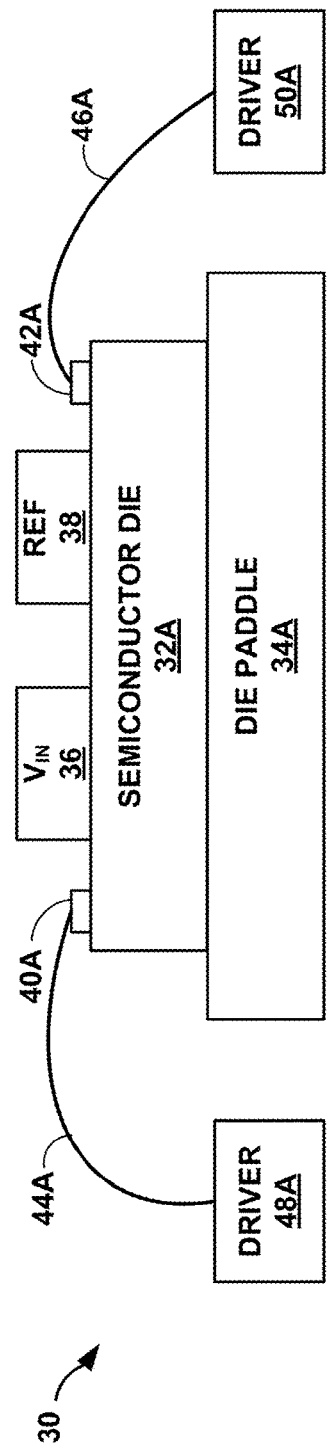
FIG. 7 is a side-view diagram of a multi-phase power converter, in accordance with some examples of this disclosure.

FIG. 7 is a side-view diagram of a multi-phase power converter 30, in accordance with some examples of this disclosure. FIG. 7 depicts semiconductor die 32A sitting on top of die paddle 34A. Control terminals 40A, 42A may be electrically connected by wire bonds 44A, 46A to driver circuits 48A, 50A, which may comprise a single driver circuit. Multi-phase power converter 30 may be fully or partially encapsulated to electrically isolate wire bonds 44A, 46A from external components.

The high-side transistor in semiconductor die 32A may comprise a source-down vertical power FET, and the low-side transistor in semiconductor die 32A may comprise a drain-down vertical power FET. For a vertical power FET, the source terminal and the drain terminal may be on opposite sides or opposite surfaces of the FET. Current in a vertical power FET may flow through the FET from top to bottom or from bottom to top. Thus, the source terminal of the high-side transistor and the drain terminal of the low-side transistor may be electrically connected to die paddle 34A, which may comprise a switch node.

First conductive element 36 and second conductive element 38 may sit on top of semiconductor die 32A. First conductive element 36 may electrically connect the drain terminal of the high-side transistor in semiconductor die 32A to an input voltage, such as a power supply. Second conductive element 38 may electrically connect the source terminal of the low-side transistor in semiconductor die 32A to a reference voltage, such as reference ground.

Figure 8:
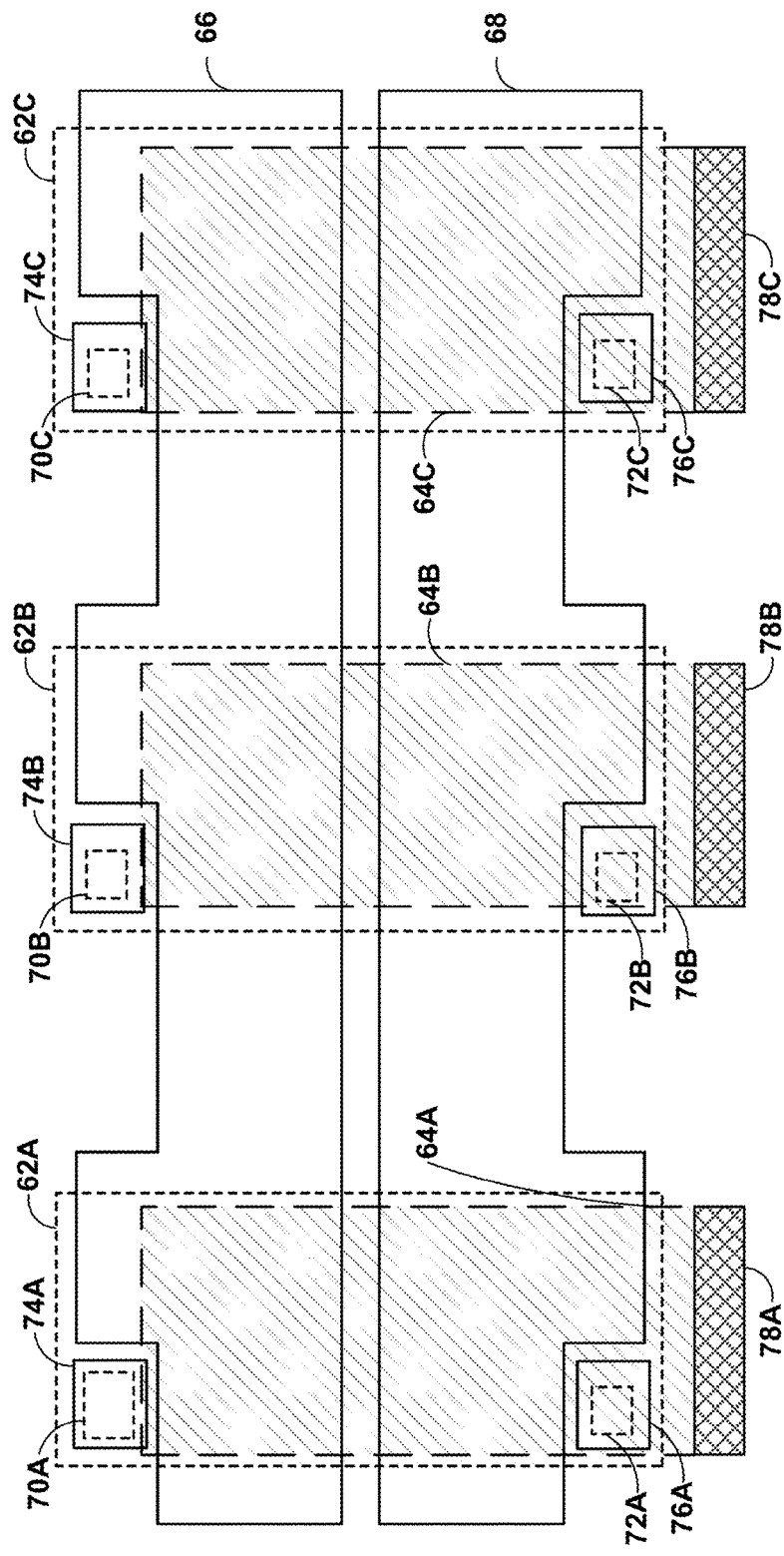
FIG. 8 is a top-view diagram of a multi-phase power converter comprising three semiconductor die, in accordance with some examples of this disclosure.

FIG. 8 is a top-view diagram of a multi-phase power converter 60 comprising three semiconductor die 62A-62C, in accordance with some examples of this disclosure. Each of semiconductor die 62A-62C may comprise a flip chip, as opposed to the wire bonding depicted in FIGS. 6-7. For flip chips, each of semiconductor die 62A-62C electrically connects to clips 64A-64C and conductive elements 66, 68 through solder bumps or copper pillars, rather than wires. Each of control terminals 70A-70C, 72A-72C may be electrically connected to driver circuits 74A-74C, 76A-76C, which may comprise a single driver circuit.

Each of clips 64A-64C may comprise a switch node for a phase of multi-phase power converter 60. Each switch node may be electrically coupled to an output phase of multi-phase power converter 60. Each of clips 64A-64C may comprise an aluminum ribbon, a copper clip, a copper layer, or any other suitable conductive material.

Figure 9:
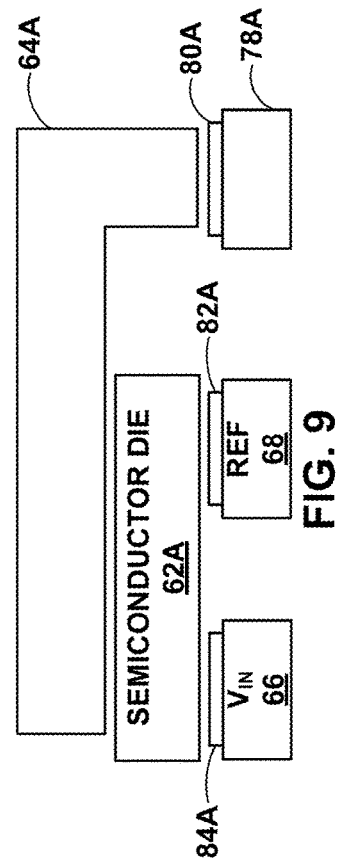
FIG. 9 is a side-view diagram of a multi-phase power converter, in accordance with some examples of this disclosure.

FIG. 9 is a side-view diagram of a multi-phase power converter 60, in accordance with some examples of this disclosure. FIG. 9 depicts semiconductor die 62A electrically connected to conductive elements 66, 68 by conductive pads 82A, 84A. Clip 64A may electrically connect the source terminal of a high-side transistor in semiconductor die 62A to a drain terminal of a low-side transistor in semiconductor die 62A. Clip 64A may electrically connect to an output node through conductive pad 80A and conductive element 78A.

The high-side transistor in semiconductor die 62A may comprise a drain-down vertical power FET, and the low-side transistor in semiconductor die 62A may comprise a source-down vertical power FET. Thus, the source terminal of the high-side transistor and the drain terminal of the low-side transistor may be electrically connected to clip 64A, which may comprise a switch node.

FIG. 10 is a top-view diagram of a device 90 comprising continuous die paddles 92, 94, in accordance with some examples of this disclosure. Each of die paddles 92, 94 may comprise a switch node of device 90. Conductive elements 100, 102 may be electrically connected to an input node and a reference node on each of transistors 96A, 96B, 98A, 98B. Transistors 96A, 96B, 98A, 98B may be discrete transistors implementing wire-bonding technology, as depicted in FIGS. 6-7. Each semiconductor die in FIGS. 10 and 11 may comprise a single transistor of transistors 96A, 96B, 98A, 98B.

In some examples, device 90 may be encapsulated by molding compound, or any other suitable insulating material, to support and electrically insulate the components of device 90. The molding compound may fully encapsulate and cover transistors 96A, 96B, 98A, 98B. The molding compound may fully or partially encapsulate and cover conductive elements 100, 102. Partially encapsulating conductive elements 100, 102 may allow for better thermal dissipation of the heat within device 90. Device 90 may be fully or partially encapsulated, or overmolded, in molding compound to form a power quad flat no-lead (PQFN) package. The PQFN package may comprise transistors 96A, 96B, 98A, 98B and conductive elements 100, 102.

FIG. 11 is a top-view diagram of a device comprising divided die paddles 112A, 112B, 114A, 114B, in accordance with some examples of this disclosure. Die paddles 112A, 112B may form a first switch node by connecting through a printed circuit board (PCB), rather than connecting directly, as depicted in FIG. 10. Die paddles 114A, 114B may form a second switch node by connecting through a PCB, rather than connecting directly. Conductive elements 120, 122 may be electrically connected to an input node and a reference node on each of transistors 116A, 116B, 118A, 118B. Transistors 116A, 116B, 118A, 118B may be discrete transistors implementing wire-bonding technology, as depicted in FIGS. 6-7.

Figure 12:
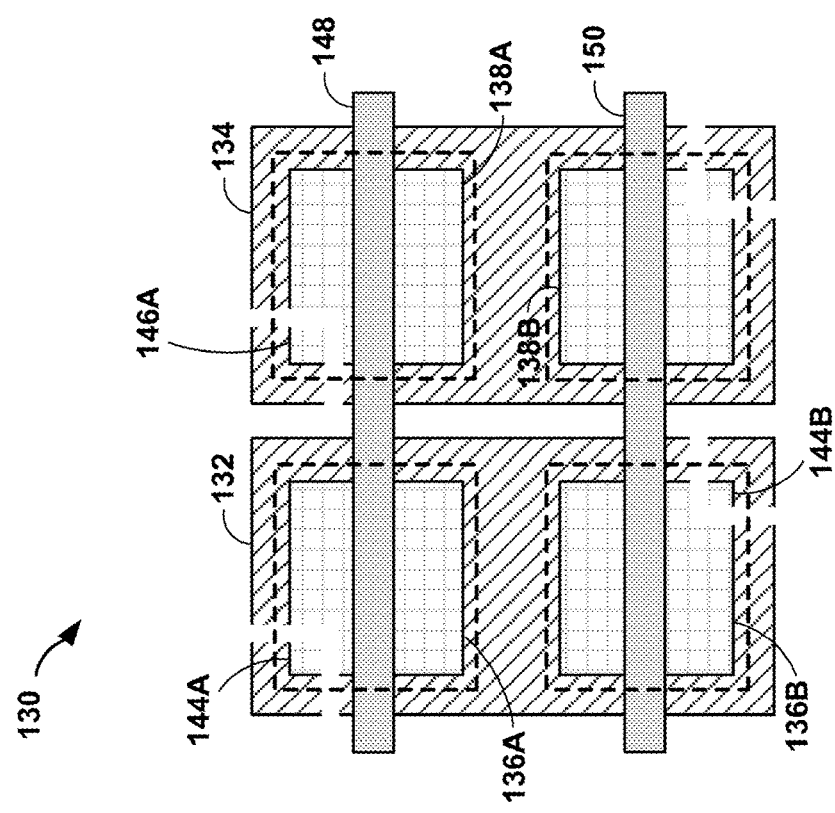
FIG. 12 is a top-view diagram of a device implementing flip-chip technology, in accordance with some examples of this disclosure.

FIG. 12 is a top-view diagram of a device 130 implementing flip-chip technology, in accordance with some examples of this disclosure. For example, a first terminal of transistor 136A may be electrically connected to conductive element 148, and a second terminal of transistor 136A may be electrically connected to continuous die paddle 132. The control terminal of transistor 136A may be electrically connected to die paddle 144A, which may connect to a driver circuit (not shown in FIG. 12). Transistors 136A, 136B, 138A, 138B may implement flip-chip technology, as depicted in FIGS. 8-9.

Figure 13:
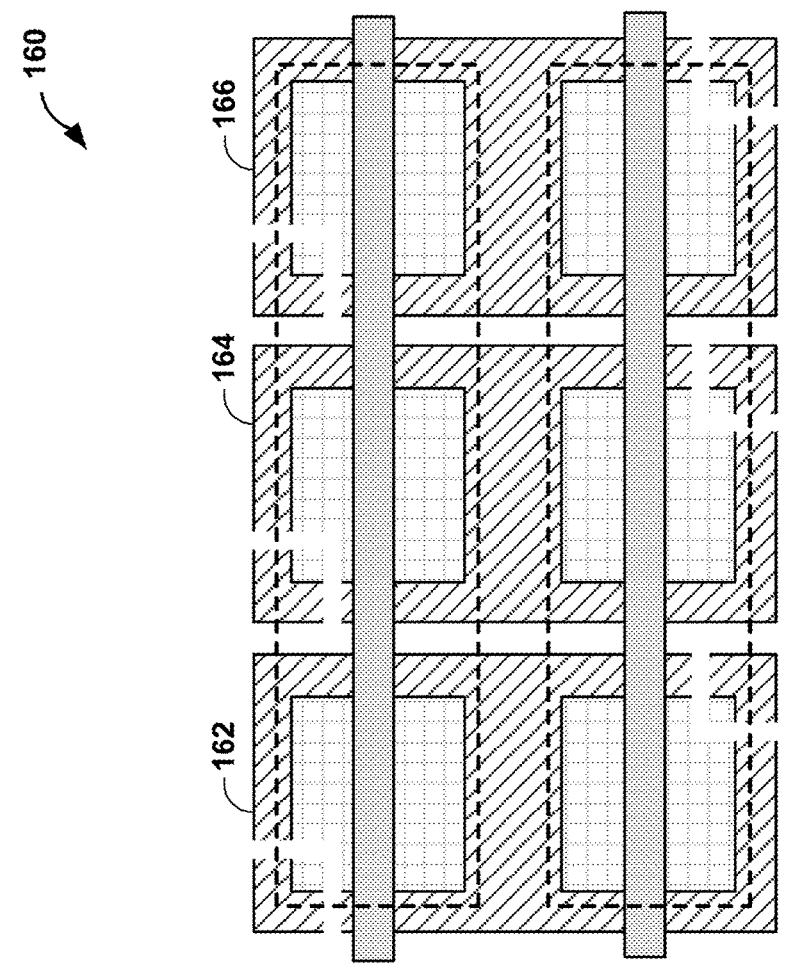
FIG. 13 is a top-view diagram of a device implementing flip-chip technology, in accordance with some examples of this disclosure.

FIG. 13 is a top-view diagram of a device 160 implementing flip-chip technology, in accordance with some examples of this disclosure. Device 160 is a three-phase device comprising continuous die paddles 162, 164, 166.

Figure 14:
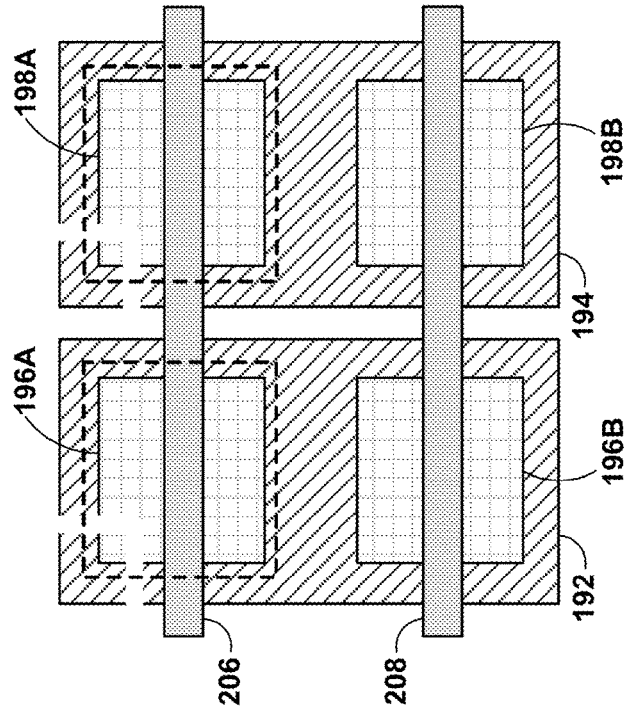
FIG. 14 is a top-view diagram of a device implementing flip-chip technology and wire-bonding technology, in accordance with some examples of this disclosure.

FIG. 14 is a top-view diagram of a device 170 implementing flip-chip technology and wire-bonding technology, in accordance with some examples of this disclosure. Transistors 176A, 178A may implement wire-bonding technology. Transistors 176B, 178B may implement flip-chip technology, as shown by the dashed lines around transistors 176B, 178B.

Each of transistors 176A, 176B, 178A, 178B may be source-up, drain-down transistors. Transistors 176A, 178A may sit on top of die paddles 172, 174 and underneath conductive element 184. Transistors 176B, 178B may sit on top of conductive element 186 and underneath die paddles 172, 174. Control terminals 168, 170 may be electrically connected to separate die paddles or clips for connection to one or more driver circuits.

Figure 15:
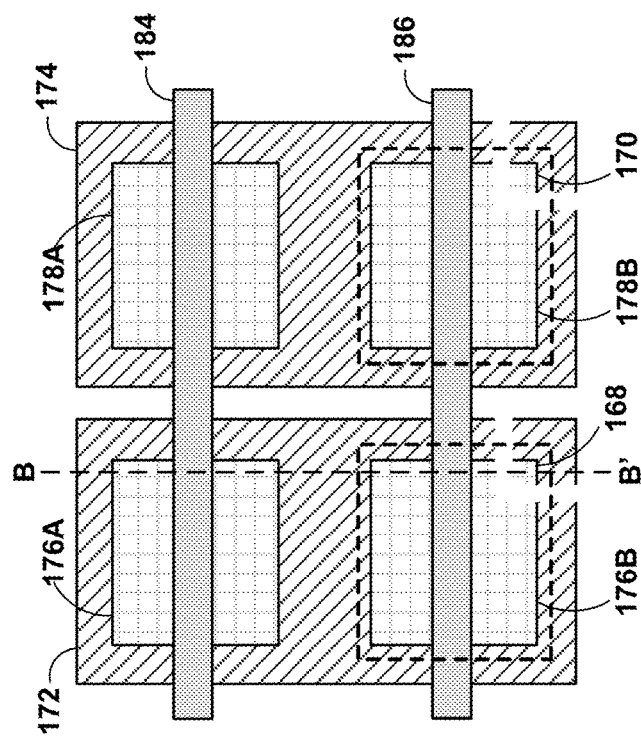
FIG. 15 is a top-view diagram of a device implementing flip-chip technology and wire-bonding technology, in accordance with some examples of this disclosure.

FIG. 15 is a top-view diagram of a device 190 implementing flip-chip technology and wire-bonding technology, in accordance with some examples of this disclosure. Transistors 196A, 198A may implement flip-chip technology, as shown by the dashed lines around transistors 196B, 198B. Transistors 196B, 198B may implement wire-bonding technology.

Each of transistors 196A, 196B, 198A, 198B may be source-down, drain-up transistors. Transistors 196A, 198A may sit on top of conductive element 206 and underneath die paddles 192, 194. Transistors 196B, 198B may sit on top of die paddles 192, 194 and underneath conductive element 206.

Figure 16:
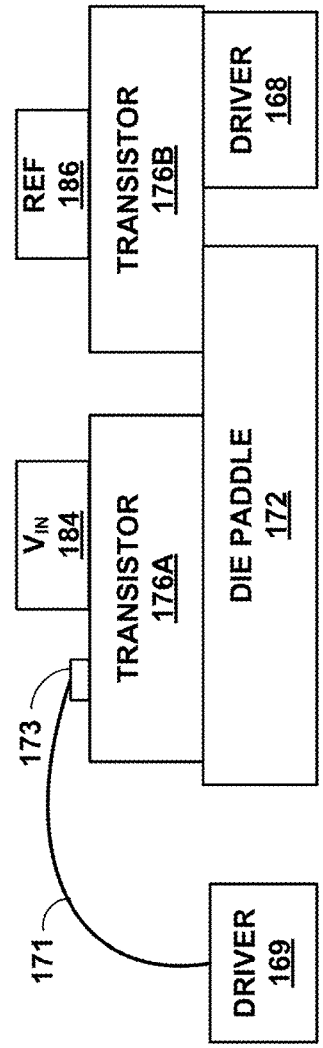
FIG. 16 is a side-view diagram of a device implementing flip-chip technology and wire-bonding technology, in accordance with some examples of this disclosure.

FIG. 16 is a side-view diagram of a device 170 implementing flip-chip technology and wire-bonding technology, in accordance with some examples of this disclosure. Transistor 176A may implement wire-bonding technology for control terminal 173. Control terminal 173 of transistor 176A may be electrically connected by wire bond 171 to driver circuit 48A. Transistor 176A may sit on die paddle 172 and underneath conductive element 184.

Transistor 176B may implement flip-chip technology. Transistor 176B may sit on die paddle 172 and driver circuit 168, which may be a die paddle electrically connected to an external driver circuit and/or the same driver circuit as driver circuit 169. Transistor 176B may sit underneath conductive element 186. FIG. 16 may correspond to the dashed line B-B' in FIG. 14.

Figure 17:
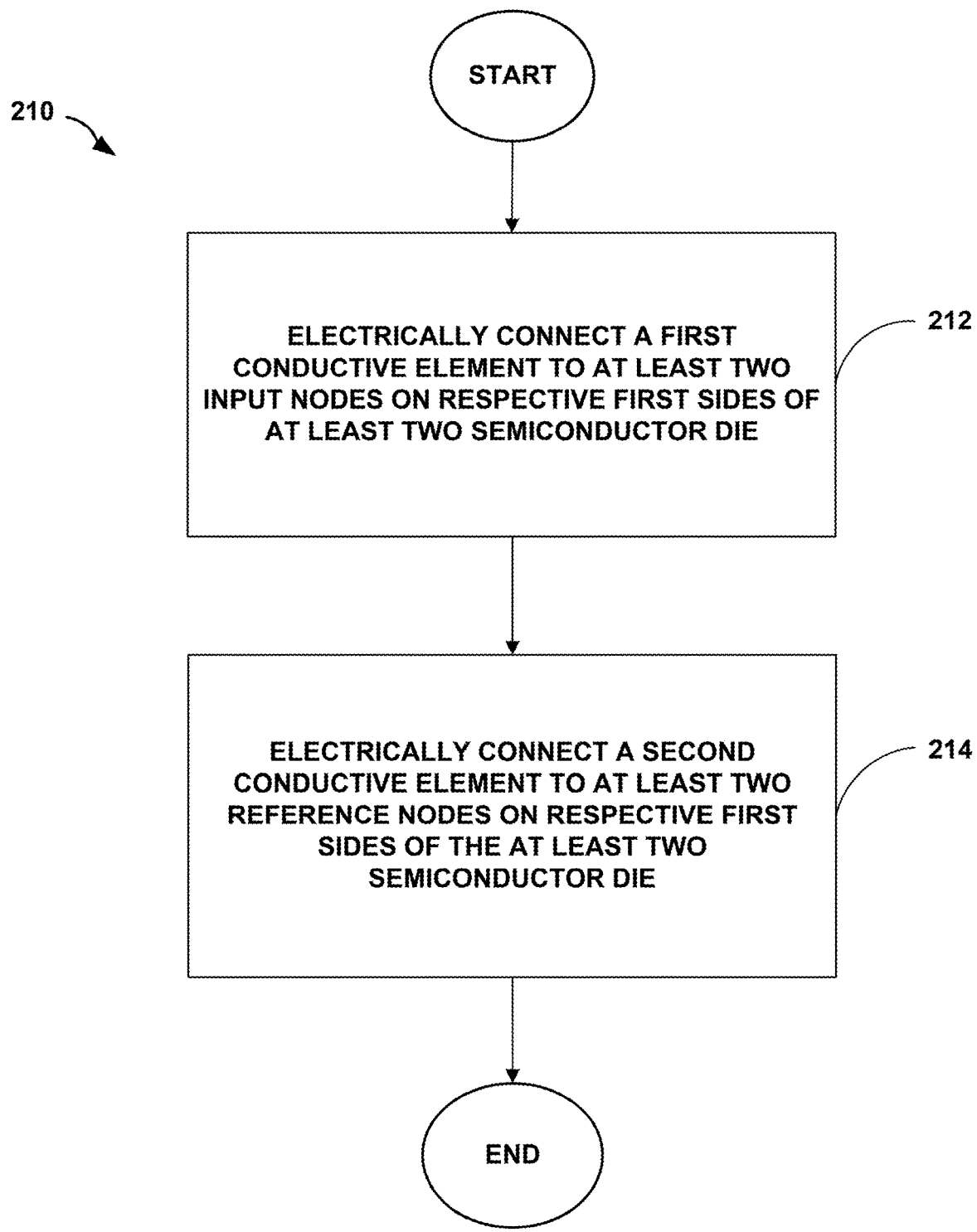
FIG. 17 is a flowchart illustrating an example technique for constructing a multi-phase power converter, in accordance with some examples of this disclosure.

FIG. 17 is a flowchart illustrating an example technique 210 for constructing a multi-phase power converter, in accordance with some examples of this disclosure. Technique 210 is described with reference to multi-phase power converter 30 in FIGS. 6-7, although other components, such as multi-phase power converter 60 in FIGS. 8-9, may exemplify similar techniques.

The technique of FIG. 17 includes electrically connecting a first conductive element 36 to at least two input nodes on respective first sides of at least two semiconductor die 32A-32C (212). First conductive element 36 may be electrically connected to an input voltage of device 30. Through the input nodes, first conductive element 36 may be electrically connected to the drain terminals of each of the high-side transistors in semiconductor die 32A-32C.

The technique of FIG. 17 includes electrically connecting a second conductive element to at least two reference nodes on respective first sides of the at least two semiconductor die (214). Second conductive element 38 may be electrically connected to a reference voltage of device 30, such as reference ground. Through the reference nodes, second conductive element 38 may be electrically connected to the source terminals of each of the low-side transistors in semiconductor die 32A-32C.

The following numbered examples demonstrate one or more aspects of the disclosure.

EXAMPLE 1

A device comprises at least two semiconductor die, wherein each respective semiconductor die of the at least two semiconductor die comprises at least two power transistors, an input node on a first side of the respective semiconductor die, a reference node on the first side of the respective semiconductor die, and a switch node on a second side of the respective semiconductor die. The device further comprises a first conductive element electrically connected to the respective input nodes of the at least two semiconductor die. The device further comprises a second conductive element electrically connected to the respective reference nodes of the at least two semiconductor die.

EXAMPLE 2

The device of example 1, wherein the first conductive element comprises a wire, an aluminum ribbon, a copper clip, or a copper layer; and the second conductive element comprises a wire, an aluminum ribbon, a copper clip, or a copper layer.

EXAMPLE 3

The device of examples 1 or 2, wherein each switch node of each respective semiconductor die of the at least two semiconductor die is electrically connected to a respective die paddle of the at least two die paddles. Each die paddle of the at least two die paddles is electrically isolated from other die paddles of the at least two die paddles. Each die paddle of the at least two die paddles comprises a leadframe or a metallization layer.

EXAMPLE 4

The device of any one of examples 1 to 3, wherein each die paddle comprises an output node of at least two output nodes, and each output node of the at least two output nodes comprises an output phase of a power converter.

EXAMPLE 5

The device of any one of examples 1 to 4, wherein the at least two power transistors comprise a high-side power transistor and a low-side power transistor; a first load terminal of each respective high-side power transistor is electrically connected to the respective input node; a second load terminal of each respective high-side power transistor is electrically connected to the respective switch node; a first load terminal of each respective low-side power transistor is electrically connected to the respective switch node; and a second load terminal of each respective low-side power transistor is electrically connected to the respective reference node.

EXAMPLE 6

The device of any one of examples 1-5, further comprising a driver circuit configured to deliver signals to at least two control terminals of the respective high-side power transistors and at least two control terminals of the respective low-side power transistors.

EXAMPLE 7

The device of any one of examples 1-6, wherein each respective high-side power transistor comprises a source-down vertical power transistor; and each respective low-side power transistor comprises a drain-down vertical power transistor.

EXAMPLE 8

The device of any one of examples 1-7, wherein the high-side power transistor is selected from a group consisting of a field effect transistor (FET), a high-electron-mobility transistor (HEMT), and an insulated gate bipolar transistor (IGBT); and the low-side power transistor is selected from a group consisting of a FET, an HEMT, and an IGBT.

EXAMPLE 9

The device of any one of examples 1-8, further comprising a overmolded PQFN package, wherein the overmolded PQFN package comprises the at least two semiconductor die, first conductive element, and second conductive element.

EXAMPLE 10

A method comprises electrically connecting a first conductive element to at least two input nodes on respective first sides of at least two semiconductor die and electrically connecting a second conductive element to at least two reference nodes on respective first sides of the at least two semiconductor die. Each semiconductor die of the at least two semiconductor die comprises at least two power transistors, an input node on a first side of the respective semiconductor die, a reference node on the first side of the respective semiconductor die, and a switch node on a second side of the respective semiconductor die.

EXAMPLE 11

The method of example 10, wherein the first conductive element comprises a wire, an aluminum ribbon, a copper clip, or a copper layer; and the second conductive element comprises a wire, an aluminum ribbon, a copper clip, or a copper layer.

EXAMPLE 12

The method of example 10 or 11, further comprising electrically connecting each switch node of each respective semiconductor die of the at least two semiconductor die to a respective die paddle of at least two die paddles; and electrically isolating each die paddle from other die paddles of the at least two die paddles.

EXAMPLE 13

The method of any one of examples 10 to 12, wherein each die paddle comprises an output node of at least two output nodes; and each output node of the at least two output nodes comprises an output phase of a power converter.

EXAMPLE 14

The method of any one of examples 10 to 13, wherein the at least two power transistors comprise a high-side power transistor and a low-side power transistor, the method further comprising electrically connecting a first load terminal of each respective high-side power transistor to the respective input node; electrically connecting a second load terminal of each respective high-side power transistor to the respective switch node; electrically connecting a first load terminal of each respective low-side power transistor to the respective switch node; and electrically connecting a second load terminal of each respective low-side power transistor to the respective reference node.

EXAMPLE 15

The method of any one of examples 10 to 14, wherein electrically connecting a control terminal of each respective high-side power transistor to a driver circuit; and electrically connecting a control terminal of each respective low-side power transistor to the driver circuit.

EXAMPLE 16

The method of any one of examples 10 to 15, wherein each respective high-side power transistor comprises a source-down vertical power transistor; and each respective low-side power transistor comprises a drain-down vertical power transistor.

EXAMPLE 17

The method of any one of examples 10 to 16, wherein the high-side power transistor comprises a fin field effect transistor; and the low-side power transistor comprises a smart field effect transistor.

EXAMPLE 18

The method of any one of examples 10 to 17, further comprising covering the at least two semiconductor die with a molding compound; and partially covering the first conductive element and the second conductive element with the molding compound.

EXAMPLE 19

A power converter comprises at least two semiconductor die, wherein each semiconductor die of the at least two semiconductor die comprises a power transistor, an input node or a reference node on a first side of the respective semiconductor die, a control node on a first side of the respective semiconductor die, and a switch node on a second side of the respective semiconductor die. The power converter further comprises a first conductive element electrically connected to the respective input nodes of the at least two semiconductor die. The power converter further comprises a second conductive element electrically connected to the respective reference nodes of the at least two semiconductor die. The power converter further comprises at least two die paddles, wherein each switch node of each respective semiconductor die of the at least two semiconductor die is electrically connected to a respective die paddle of the at least two die paddles, and each die paddle of the at least two die paddles is electrically isolated from other die paddles of the at least two die paddles.

EXAMPLE 20

The power converter of example 19, further comprising a driver circuit configured to deliver signals to the high-side control node and the low-side control node, wherein the first conductive element comprises a wire, an aluminum ribbon, a copper clip, or a copper layer; and the second conductive element comprises a wire, an aluminum ribbon, a copper clip, or a copper layer.

Various examples of the disclosure have been described. Any combination of the described systems, operations, or functions is contemplated. These and other examples are within the scope of the following claims.

What is claimed is:

1. A device comprising:
   a first discrete power transistor;
   a second discrete power transistor;
   a third discrete power transistor;
   a fourth discrete power transistor;
   a high-side conductive element electrically connected to a first side of the first discrete power transistor and a first side of the second discrete power transistor;
   a low-side conductive element electrically connected to a first side of the third discrete power transistor and a first side of the fourth discrete power transistor, the low-side conductive element being electrically isolated from the high-side conductive element;
   a first die paddle electrically connected to a second side of the first discrete power transistor and a second side of the third discrete power transistor; and
   a second die paddle electrically connected to a second side of the second discrete power transistor and a second side of the fourth discrete power transistor, the second die paddle being electrically isolated from the first die paddle.

2. The device of claim 1, further comprising a driver circuit configured to deliver signals to a control node of the first discrete power transistor, a control node of the second discrete power transistor, a control node of the third discrete power transistor, and a control node of the fourth discrete power transistor,
   wherein the high-side conductive element comprises a wire, an aluminum ribbon, a copper clip, or a copper layer; and
   wherein the low-side conductive element comprises a wire, an aluminum ribbon, a copper clip, or a copper layer.

3. The device of claim 1,
   wherein the first die paddle comprises a first continuous die paddle electrically connected to the first discrete power transistor and the third discrete power transistor, and
   wherein the second die paddle comprises a second continuous die paddle electrically connected to the second discrete power transistor and the fourth discrete power transistor.

4. The device of claim 3,
   wherein the first continuous die paddle comprises a leadframe or a metallization layer electrically connected to the first discrete power transistor and the third discrete power transistor, and
   wherein the second continuous die paddle comprises a leadframe or a metallization layer electrically connected to the second discrete power transistor and the fourth discrete power transistor.

5. The device of claim 1,
   wherein the first die paddle comprises a first output node configured to produce a first phase of an output signal of a power converter, and
   wherein the second die paddle comprises a second output node configured to produce a second phase of the output signal of the power converter.

6. The device of claim 1,
   wherein the first discrete power transistor comprises a source-down vertical power transistor,
   wherein the second discrete power transistor comprises a source-down vertical power transistor,
   wherein the third discrete power transistor comprises a drain-down vertical power transistor, and
   wherein the fourth discrete power transistor comprises a drain-down vertical power transistor.

7. The device of claim 1, wherein each discrete power transistor of the first discrete power transistor, the second discrete power transistor, the third discrete power transistor, and the fourth discrete power transistor comprises:
   a field effect transistor;
   a high-electron-mobility transistor; or
   an insulated gate bipolar transistor.

8. The device of claim 1,
   wherein the first discrete power transistor comprises a fin field effect transistor,
   wherein the second discrete power transistor comprises a fin field effect transistor,
   wherein the third discrete power transistor comprises a smart field effect transistor, and
   wherein the fourth discrete power transistor comprises a smart field effect transistor.

9. The device of claim 1, wherein the device is at least partially encapsulated in molding compound to form a power-quad flat no-lead package comprising the first discrete power transistor, the second discrete power transistor, the third discrete power transistor, the fourth discrete power transistor, the high-side conductive element, the low-side conductive element, the first die paddle, and the second die paddle.

10. The device of claim 1, further comprising:
    a fifth discrete power transistor;
    a sixth discrete power transistor; and
    a third die paddle electrically connected to a second side of the fifth discrete power transistor and a second side of the sixth discrete power transistor, the third die paddle being electrically isolated from the first die paddle and from the second die paddle, and
    wherein the high-side conductive element is electrically connected to a first side of the fifth discrete power transistor, and
    wherein the low-side conductive element is electrically connected to a first side of the sixth discrete power transistor.

11. The device of claim 10,
    wherein the first die paddle comprises a first output node configured to produce a first phase of an output signal of a power converter,
    wherein the second die paddle comprises a second output node configured to produce a second phase of the output signal of the power converter, and
    wherein the third die paddle comprises a third output node configured to produce a third phase of the output signal of the power converter.

12. A method comprising:
    electrically connecting a high-side conductive element to a first side of a first discrete power transistor;
    electrically connecting the high-side conductive element to a first side of a second discrete power transistor;
    electrically connecting a low-side conductive element to a first side of a third discrete power transistor, the low-side conductive element being electrically isolated from the high-side conductive element;
    electrically connecting the low-side conductive element to a first side of a fourth discrete power transistor;
    electrically connecting a first die paddle to a second side of the first discrete power transistor;
    electrically connecting the first die paddle to a second side of the third discrete power transistor;

electrically connecting a second die paddle to a second side of the second discrete power transistor, the second die paddle being electrically isolated from the first die paddle; and electrically connecting the second die paddle to a second side of the fourth discrete power transistor.

13. The method of claim 12, wherein the high-side conductive element comprises a wire, an aluminum ribbon, a copper clip, or a copper layer, and wherein the low-side conductive element comprises a wire, an aluminum ribbon, a copper clip, or a copper layer.

14. The method of claim 12, further comprising:

electrically connecting a control terminal of the first discrete power transistor to a driver circuit;

electrically connecting a control terminal of the second discrete power transistor to the driver circuit;

electrically connecting a control terminal of the third discrete power transistor to the driver circuit; and electrically connecting a control terminal of the fourth discrete power transistor to the driver circuit.

15. The method of claim 12, wherein the first die paddle comprises a first continuous die paddle electrically connected to the first discrete power transistor and the third discrete power transistor, wherein the second die paddle comprises a second continuous die paddle electrically connected to the second discrete power transistor and the fourth discrete power transistor, wherein the first continuous die paddle comprises a leadframe or a metallization layer electrically connected to the first discrete power transistor and the third discrete power transistor, and wherein the second continuous die paddle comprises a leadframe or a metallization layer electrically connected to the second discrete power transistor and the fourth discrete power transistor.

16. The device of claim 12, wherein the first die paddle comprises a first output node configured to produce a first phase of an output signal of a power converter, and wherein the second die paddle comprises a second output node configured to produce a second phase of the output signal of the power converter.

17. The method of claim 12, further comprising:

covering the at least two semiconductor die with a molding compound; and at least partially covering the first conductive element and the second conductive element with the molding compound.

18. A device comprising:

a first source-down fin field power transistor including a source terminal on a second side of the first source-down fin field power transistor;

a second source-down fin field power transistor including a source terminal on a second side of the second source-down fin field power transistor;

a third drain-down power transistor including a drain terminal on a second side of the third drain-down power transistor;

a fourth drain-down power transistor including a drain terminal on a second side of the fourth drain-down power transistor;

a high-side conductive element electrically connected to a first side of the first source-down fin field power transistor and a first side of the second source-down fin field power transistor;

a low-side conductive element electrically connected to a first side of the third drain-down power transistor and a first side of the fourth drain-down power transistor, the low-side conductive element being electrically isolated from the high-side conductive element;

a first continuous die paddle electrically connected to the second side of the first source-down fin field power transistor and the second side of the third drain-down power transistor; and a second die paddle electrically connected to the second side of the second source-down fin field power transistor and the second side of the fourth drain-down power transistor, the second die paddle being electrically isolated from the first die paddle.

19. The device of claim 18, wherein the first source-down fin field power transistor and the third drain-down power transistor are integrated into a first single semiconductor die, and wherein the second source-down fin field power transistor and the fourth drain-down power transistor are integrated into a second single semiconductor die.

20. The device of claim 18, wherein the first source-down fin field power transistor comprises a first discrete transistor, wherein the second source-down fin field power transistor comprises a second discrete transistor, wherein the third drain-down power transistor comprises a third discrete transistor, and wherein the fourth drain-down power transistor comprises a fourth discrete transistor.

* * * * *